United States Patent
Takahashi

(10) Patent No.: US 6,746,251 B2
(45) Date of Patent: Jun. 8, 2004

(54) IC SOCKET WITH A COVER MEMBER AND GUIDING MEMBERS

(75) Inventor: Katunori Takahashi, Higashimurayama (JP)

(73) Assignee: Yamaichi Electronics Co., Ltd., Tokyo (JP)

(*) Notice: Subject to any disclaimer, the term of this patent is extended or adjusted under 35 U.S.C. 154(b) by 106 days.

(21) Appl. No.: 10/090,799

(22) Filed: Mar. 6, 2002

(65) Prior Publication Data

US 2002/0132520 A1 Sep. 19, 2002

(30) Foreign Application Priority Data

Mar. 7, 2001 (JP) ......................................... 2001-063994

(51) Int. Cl.[7] .............................................. H01R 12/00
(52) U.S. Cl. ........................................... 439/68; 439/526
(58) Field of Search ........................ 439/66, 68, 71–73, 439/91, 526

(56) References Cited

U.S. PATENT DOCUMENTS 5,431,579 A * 7/1995 Kishi et al. ................. 439/266
6,196,849 B1 * 3/2001 Goodwin ...................... 439/71
2002/0182916 A1 * 12/2002 Takahashi et al. ........... 439/266

* cited by examiner

Primary Examiner—Tho D. Ta
Assistant Examiner—James R. Harvey
(74) Attorney, Agent, or Firm—Finnegan, Henderson, Farabow, Garrett & Dunner, LLP

(57) ABSTRACT

An IC socket is disclosed which facilitates automatic mounting of an IC package without a fear of lead terminal deformation and reduces the number of steps of assembling contacts into a socket body. The IC socket is an open top type IC socket which includes a socket body; and a cover member mounted vertically movable to the socket body to open and close contacts, wherein the socket body has a mounting portion on which to support an IC package mounted on the socket, and the cover member has a square opening facing the mounting portion and inclined guide wall surfaces leading to the opening and adapted to guide the mounted IC package onto the mounting portion.

9 Claims, 5 Drawing Sheets

IC SOCKET WITH A COVER MEMBER AND GUIDING MEMBERS

This application is based on Patent Application No. 2001-063994 filed Mar. 7, 2001 in Japan, the content of which is incorporated hereinto by reference.

BACKGROUND OF THE INVENTION

1. Field of the Invention

The present invention relates to an IC socket used for inspecting IC packages in a semiconductor device manufacturing process and more particularly to an open top type IC socket which has a socket body and a cover member attached vertically movable to the socket body to open and close contacts.

2. Description of the Related Art

In this kind of conventional IC sockets, to efficiently mount and position mass-produced IC packages in an IC socket by using a robot, it is conventional practice to provide a socket body with inclined guide walls that restrict and guide movement of an IC package or to form guide posts projecting at corners of the socket body and guide the IC package with its lead terminals being in contact with the guide posts.

In the conventional IC socket of a type having the inclined guide walls on the socket body, however, the assembly into the socket body of a plurality of contacts, which are to be connected with the lead terminals of an IC package, is not easy as it is hindered by the inclined guide wall rising above the contacts, thus increasing the number of assembly steps.

On the other hand, in a type having guide posts projecting at corners of the socket body, since the lead terminals contacting the guide posts are limited to those present at the corners of the IC package, a load bears on only the contacting lead terminals, giving rise to a possibility of these lead terminals being deformed.

Another drawback is that the projecting guide posts become a hindrance and limit the moving path of the robot when the robot holds the IC package by suction and mounts it on the IC socket.

SUMMARY OF THE INVENTION

It is therefore an object of the present invention to provide an IC socket which can solve the above-described problem and which can facilitate automatic mounting of an IC package without fear of lead terminal deformation and reduce the number of steps in assembling the contacts into the socket body.

In the first aspect of the present invention, there is provided an open top type IC socket comprising:
 a socket body; and
 a cover member mounted vertically movable to the socket body to open and close contacts;
 wherein the socket body has a mounting portion to support an IC package mounted on the socket, and the cover member has a square opening facing the mounting portion and inclined guide wall surfaces leading to the opening and adapted to guide the IC package to be mounted onto the mounting portion.

Here, at least two opposing sides of the opening substantially may match with an envelope joining tips of lead terminals extending from the IC package to be mounted.

The inclined guide wall surfaces may be arranged symmetrical with respect to longitudinal and lateral center lines of the square opening and each may comprise a first inclined guide wall surface traversing each of the center lines, a second inclined guide wall surface provided at each corner portion and having an inclination angle larger than an inclination angle of the first inclined guide wall surface, and a third inclined guide wall surface connecting to the first and second inclined guide wall surfaces.

A plurality of fixed contacts may be arranged around the mounting portion and two opposing sides of the opening substantially may match with an envelope joining outer ends of the fixed contacts.

In the second aspect of the present invention, there is provided an IC socket comprising:
 a socket body having a mounting portion for supporting an IC package and a plurality of contacts arranged around the mounting portion to come into contact with tips of lead terminals extending from the IC package; and
 a cover member having an opening at a center thereof and mounted vertically movable to the socket body to open and close the contacts;
 wherein the opening has its lower edge formed into a square facing the mounting portion and has inclined guide wall surfaces for guiding the IC package onto the mounting portion.

Here, the contacts each may have a base portion embedded in the socket body, a first arm extending from the base portion and having a first contact at its tip, and a second arm extending from the base portion and having a second contact at its tip and a curved elastic portion at its intermediate portion.

The first contacts at the tips of the first arms may be secured to the socket body.

Two opposing sides of the opening may almost match with an envelope joining outer ends of the first contacts of the first arms of the contacts.

At least two opposing sides of the opening may almost match with an envelope joining tips of lead terminals extending from the IC package.

The inclined guide wall surfaces may be arranged symmetrical with respect to longitudinal and lateral center lines of the square opening and each may comprise a first inclined guide wall surface crossing each of the center lines, a second inclined guide wall surface provided at each corner portion and having an inclination angle larger than an inclination angle of the first inclined guide wall surface, and a third inclined guide wall surface connecting to the first and second inclined guide wall surfaces.

The contacts each may have a base portion embedded in the socket body, a first arm extending from the base portion and having a first contact at its tip, and a second arm extending from the base portion and having a second contact at its tip and a curved elastic portion at its intermediate portion.

The first contacts at the tips of the first arms may be secured to the socket body.

Two opposing sides of the opening may almost match with an envelope joining outer ends of the first contacts of the first arms of the contacts.

At least two opposing sides of the opening may almost match with an envelope joining tips of lead terminals extending from the IC package.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Figure 1:
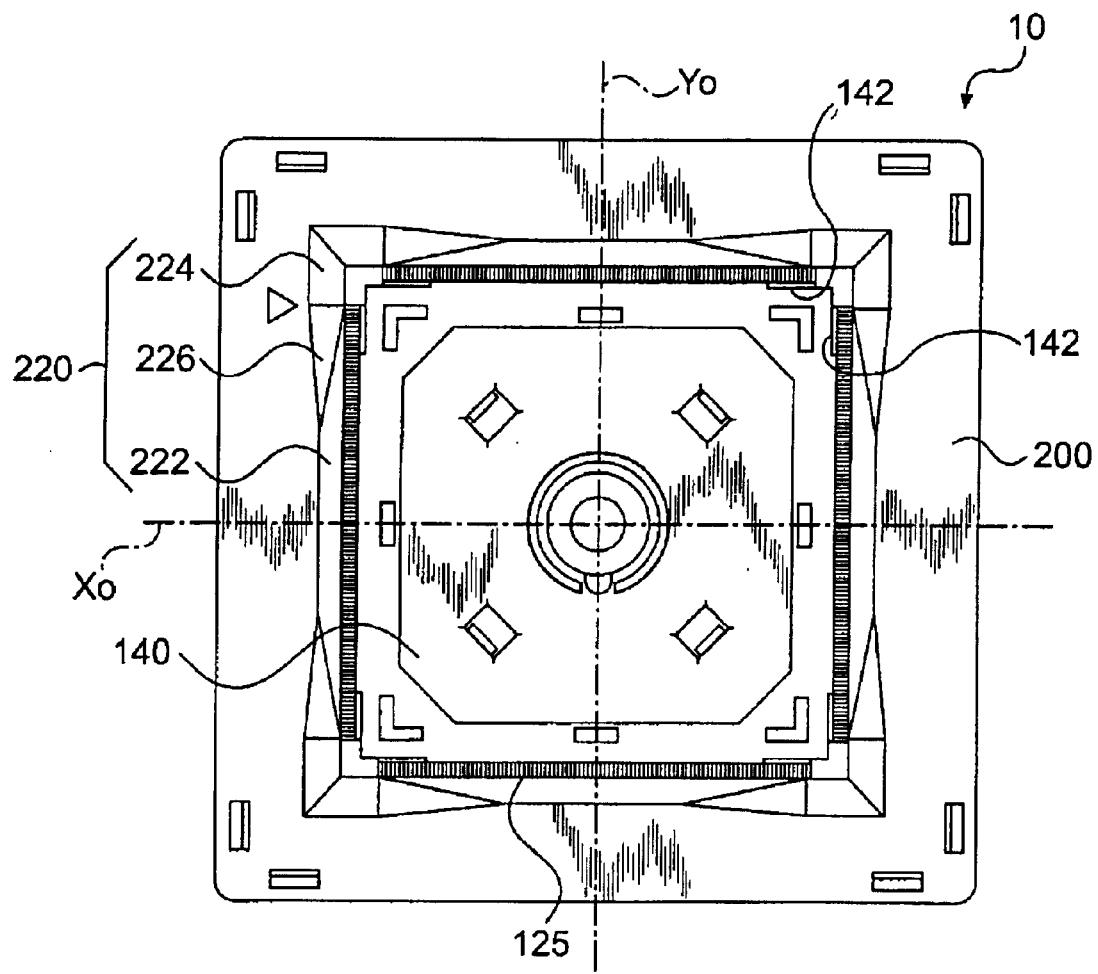
FIG. 1 is a plan view showing one embodiment of an IC socket according to the present invention.
Figure 2:
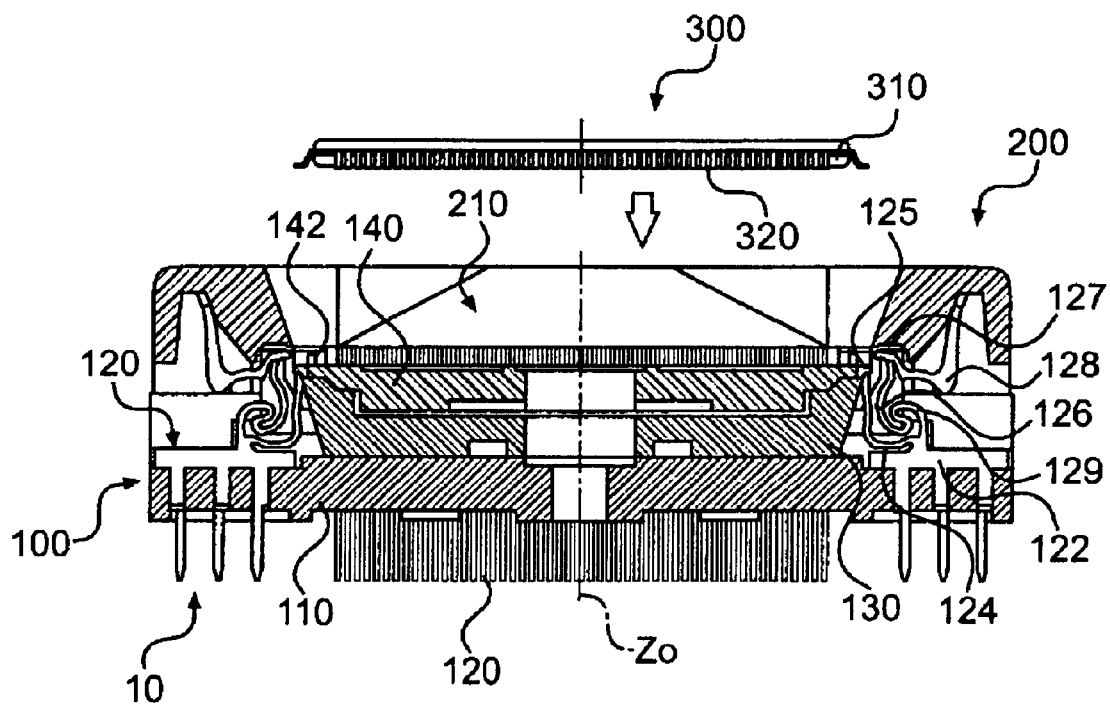
FIG. 2 is a cross section of the IC socket taken along the center line Xo of FIG. 1.

Now, a preferred embodiment of the present invention will be described by referring to the accompanying drawings.

As shown in FIG. 1 to FIG. 4, an IC socket 10 according to one embodiment of this invention is a so-called open top type IC socket which generally has a socket body 100 and a cover member 200 mounted vertically movable on the socket body 100 to open and close contacts described later.

The socket body 100 includes a socket base 110 formed from an insulating substrate, square in plan view, in which a plurality of contacts 120 are arrayed along each of its four sides. A mount 130, square in plan view, is positioned at a central portion of the socket base 110 and press-fitted to it. A positioning seat 140, also square in plan view but slightly smaller than the mount 130, is removably provided on the top of the mount 130. The positioning seat 140 constitutes a mounting portion for supporting an IC package 300 mounted on the IC socket 10 and supports a resin body 310 of the IC package 300 with positioning projections 142 protruding from the positioning seat 140 at its four corners. More specifically, at each corner paired positioning projections 142 are arranged perpendicular to each other and engage perpendicularly intersecting corner inclined surfaces of the body 310 of the IC package 300 to support the IC package 300.

The contacts 120 in this embodiment are of a so-called two-contact type having two contacts each. The contacts 120 are each formed of a conductive material and have a base portion 122 embedded in the socket base 110, a first arm 124 and a second arm 126 extending from the base portion 122, and an operation lever 128 connected to the second arm 126, all integrally formed by punching. The first arm 124 integrally has a first contact 125 at its end and the second arm 126 integrally has a second contact 127 at its end. The second arm 126 has its intermediate portion formed into a curved elastic portion 129. The first contacts 125 are arranged on an upper surface periphery of the mount 130 along the sides of the positioning seat 140.

The socket base 110 has arranged outside the periphery of the mounting portion a large number of slits, which are the same in number and pitch as the contacts 120 and lead terminals 320 of the IC package 300. The slits receive the first and second arms 124, 126 and guide the second arm 126 as it moves.

Figure 5:
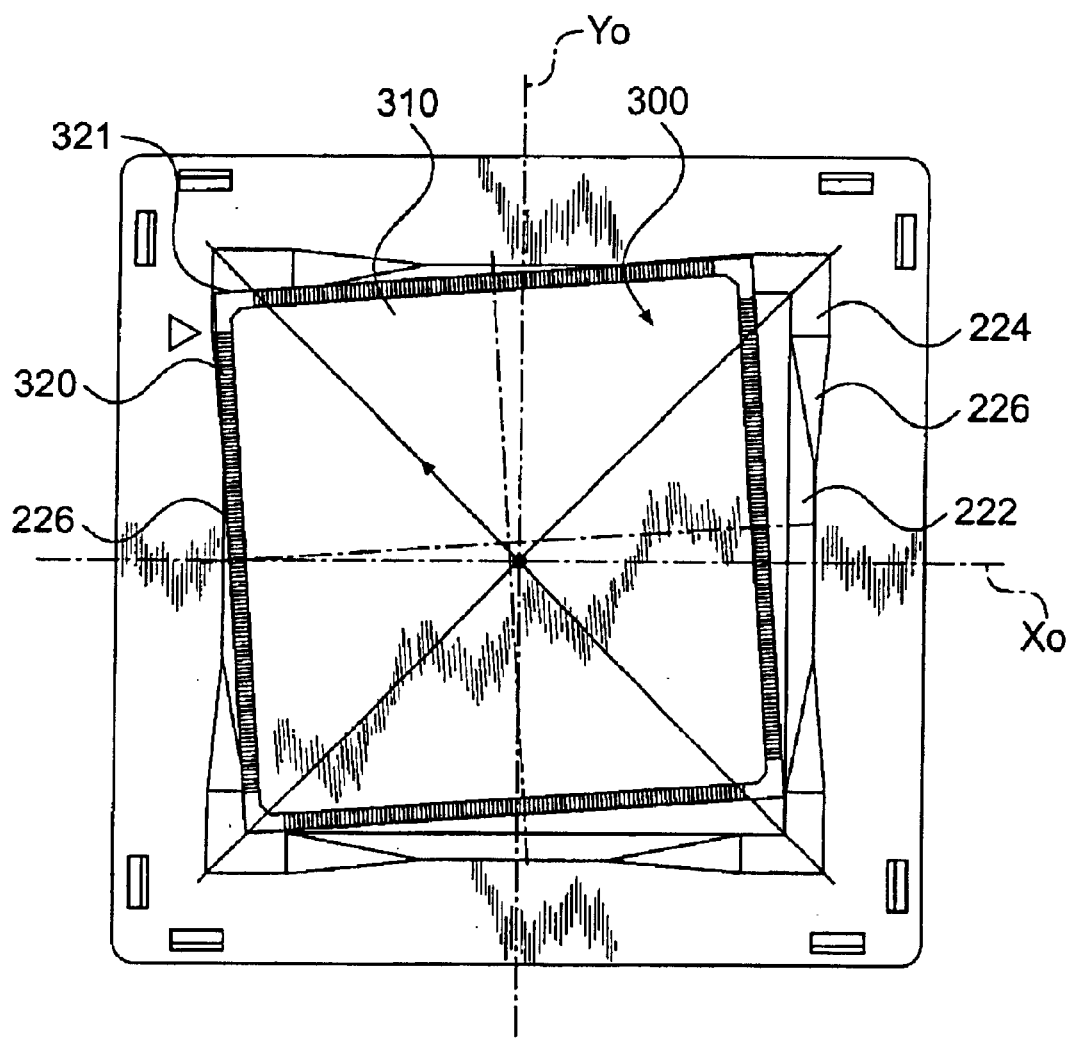
FIG. 5 is the same plan view as FIG. 1 of the IC socket according to the present invention, showing an example of how an IC package is guided.

Next, the cover member 200 has an opening 210 square in plan view and facing the mounting portion and inclined guide wall surfaces 220 leading to the opening 210 and adapted to guide the IC package 300 onto the mounting portion. The opening 210 is so sized that two opposing sides of the opening 210 almost match with an envelope 321 joining tips of the lead terminals 320 extending from the two opposing sides of the IC package 300. An example of envelope 321 is shown in FIG. 5. In this embodiment, the lead terminals 320 extend from four sides of the IC package 300 and thus the lower edges of the four sides of the opening 210 almost match with envelope 321 joining the tips of the lead terminals 320. For an IC package with its lead terminals extending from only two opposing sides, the size of the opening need only be set so that the lower edges of the corresponding two opposing sides of the opening almost match with the envelope 321 joining the tips of the lead terminals 320.

Further, on the outer periphery of the positioning seat 140 that constitutes the mounting portion, a plurality of first contacts 125 as fixed contacts are arranged. The size of the opening is also set so that the lower edges of the two opposing sides of the opening 210 almost match with envelope 321 joining outer ends of the first contacts 125.

The inclined guide wall surfaces 220 in the cover member 200 are arranged symmetrical with respect to the longitudinal and lateral center lines Xo and Yo of the square opening 210. The inclined guide wall surfaces 220 traverse the center line Xo or Yo and each have a first inclined guide wall surface 222 inclined at an angle $\theta1$ to a vertical surface containing a center line Zo perpendicular to the longitudinal and lateral center lines Xo and Yo and one of the longitudinal and lateral center lines Xo and Yo, a second inclined guide wall surface 224 provided at each corner portion and having an inclination angle $\theta2$ larger than the inclination angle $\theta1$ of the first inclined guide wall surface, and a third inclined guide wall surface 226 connecting to the first and second inclined guide wall surfaces 222 and 224. Since the third inclined guide wall surface 226 connects to both of the first and second inclined guide wall surfaces 222 and 224 having different inclination angles, it forms a composite inclined surface which recedes from $\theta1$ to $\theta2$ in inclination angle with respect to the vertical surface with a predetermined escape angle $\beta$ as the viewing point moves from the center line Xo or Yo toward each corner.

Figure 3:
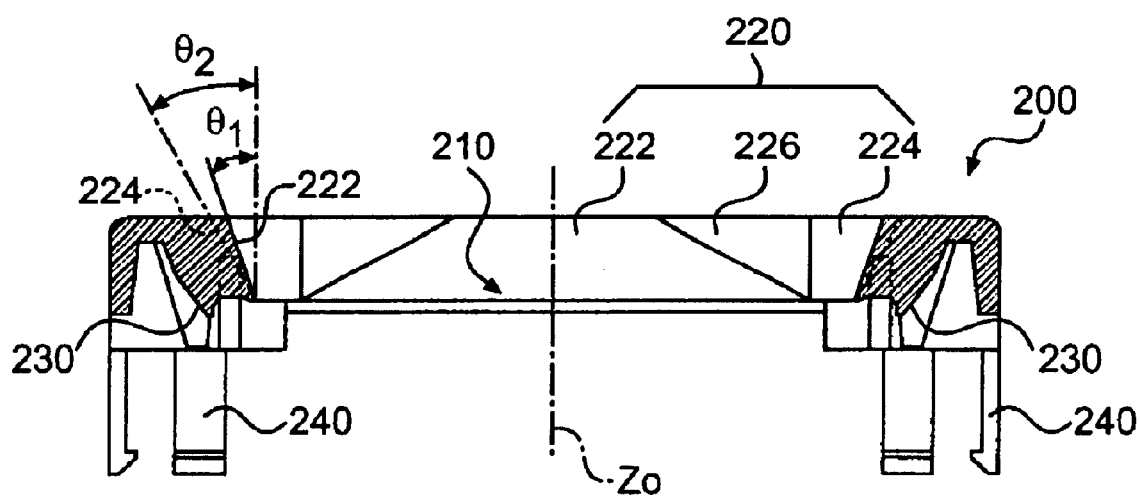
FIG. 3 is a cross section of a cover member of the IC socket according to the present invention taken along the center line Xo of FIG. 1.
Figure 4:
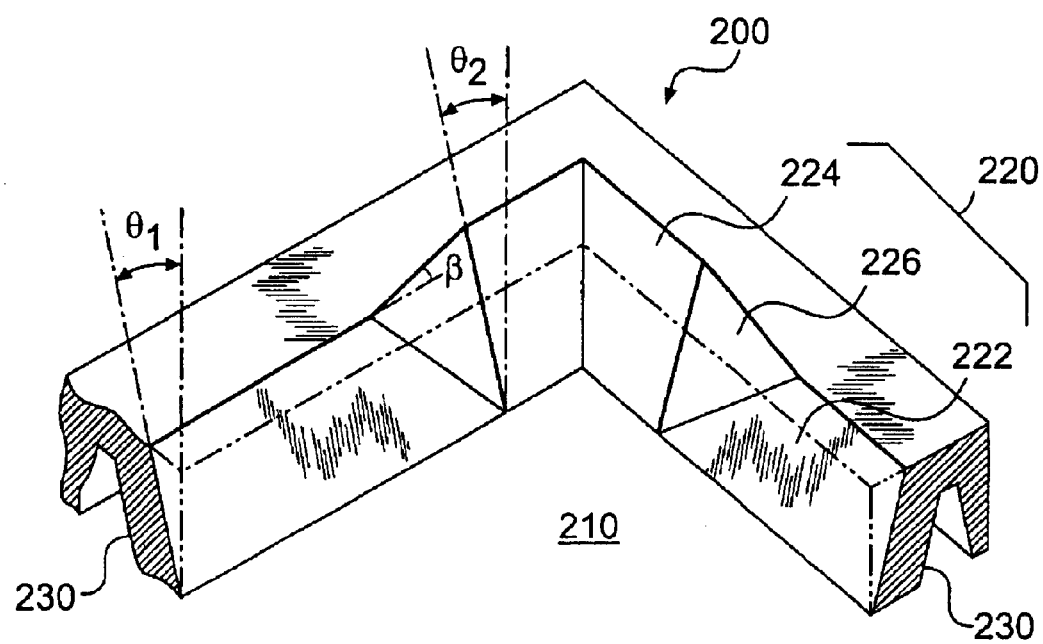
FIG. 4 is an enlarged partial perspective view of the cover member of the IC socket according to the present invention.

An underside of the cover member 200 is formed with inclined cam surfaces 230 that engage with the operation lever 128. Guide claws 240 extend downward from the cover member 200, as shown in FIG. 3, to allow the cover member 200 to be vertically movably mounted on the socket body 100.

In the IC socket 10 of the embodiment above, when the cover member 200 is pressed against the socket body 100 from above by a robot arm not shown, the operation levers 128 engaging with the inclined cam surfaces 230 are moved against the spring force of the curved elastic portions 129 of the second arms 126, parting the second contacts 127 of the second arms 126 from the first contacts 125 of the first arms 124. In that state, when the IC package 300 that was held by suction with a robot arm or the like is released, the IC package 300 falls onto the IC socket 10, as indicated by arrow of FIG. 2.

When during the fall the IC package 300 is deviated to one side or inclined with respect to the center line Zo of the IC socket 10, the tips of the lead terminals 320 of the IC package 300 first abut with and are guided by the first inclined guide wall surface 222 of the inclined guide wall surface 220 on that side toward which the IC package 300 is deviated. Then, the tips of the lead terminals 320 on the opposite side abut with and are guided by the first inclined guide wall surface 222 on the opposite side. As a result, the IC package 300 is supported on the positioning seat 140, with the corner inclined surfaces of the IC package body 310 abutting against the positioning projections 142.

The inclined guide wall surfaces 220 lead to the opening 210, and each side of the opening 210 almost agrees with envelope 321 joining the tips of the lead terminals 320 extending from the IC package 300 to be mounted on the socket and also with envelope 321 joining the outer ends of the first contacts 125. Hence, the IC package 300 that has been engaged and guided by the first inclined guide wall surfaces 222 is now supported on the positioning seat 140 with the corner inclined surfaces of its body 310 abutting against the positioning projections 142 and with the lead terminals 320 precisely positioned on the first contacts 125.

When on the other hand the IC package 300 is about to be fitted onto the positioning seat 140 in a deviated and rotated state with respect to the center line Zo but with no inclination to the horizontal plane, as shown in FIG. 5, the tips of the lead terminals 320 of the IC package 300 at the corner portions abut with the third inclined guide wall surfaces 226 and are guided diagonally downward along the third inclined guide wall surfaces 226 toward the center line Zo, causing the IC package 300 to rotate in the horizontal plane. As a result, the IC package 300 is now guided by the first inclined guide wall surfaces 222 in a manner described above until it is supported on the positioning seat 140 with the corner inclined surfaces of the IC package body 310 abutting against the positioning projections 142 and with the lead terminals 320 precisely positioned on the first contacts 125.

Then, when the robot arm is retracted upward to free the cover member 200 from the pressing force, the spring force of the curved elastic portions 129 of the second arms 126 pushes up the cover member 200 and at the same time causes the second contacts 127 of the second arms 126 to bear against, from above, the lead terminals 320 of the IC package 300 on the first contacts 125 of the first arms 124 thereby clamping the lead terminals 320 between the first contacts 125 and the second contacts 127.

Although in the above embodiment the IC package is positioned by using the guiding action between the tips of the lead terminals extending from the four sides of the IC package and the inclined guide wall surfaces, it is needless to say that in the IC packages having the lead terminals on only two sides, the guiding action on the two sides having no lead terminals need only be produced by the engagement between the side surfaces of the IC package body and the inclined guide wall surfaces.

Further, while the two-contact type IC socket having the first and second contact arms have been described above, the present invention is also applicable to a so-called one-contact type IC socket having only one arm for each contact.

As can be seen from the above description, because in this invention the cover member has the square opening facing the mounting portion and the inclined guide wall surfaces leading to the opening and guiding the IC package onto the mounting portion, there are no inclined guide walls extending above the contacts, which in turn facilitates the assembly of the contacts into the socket body. Further, since there is no need to provide projecting guide posts at the corners of the socket body, it is possible to prevent deformations of the lead terminals that would otherwise be caused by a load bearing on only those lead terminals present at the corners of the IC package. Further, because there are no guide posts, the moving path of the robot is not limited, allowing the mounting of the IC package to be performed with ease and in a short time.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. An open top type IC socket comprising:
  a socket body; and
  a cover member mounted vertically movable to the socket body to open and close contacts;
  wherein said socket body has a mounting portion to support an IC package, and said cover member has an opening facing said mounting portion and inclined guide wall surfaces leading to said opening and adapted to guide the IC package to be mounted onto the mounting portions; and
  wherein the inclined guide wall surfaces are arranged symmetrical with respect to longitudinal and lateral center lines of the opening, and each inclined guide wall surface comprises a first inclined guide wall surface traversing each of the center lines, a second inclined guide wall surface provided at each corner portion and having an inclination angle larger than inclination angle of the first inclined guide wall surface, and a third inclined guide wall surface connecting to the first and second inclined guide wall surfaces.

2. An IC socket as claimed in claim 1, wherein at least two opposing sides of said opening substantially match with an envelope joining tips of lead terminals extending from the IC package to be mounted.

3. An IC socket as claimed in claim 1, wherein a plurality of fixed contacts are arranged around the mounting portion and two opposing sides of the opening substantially match with an envelope joining outer ends of the fixed contacts.

4. An IC socket as claimed in claim 2, wherein a plurality of fixed contacts are arranged around the mounting portion and two opposing sides of the opening substantially match with an envelope joining outer ends of the fixed contacts.

5. An IC socket comprising:
  a socket body having a mounting portion for supporting an IC package and a plurality of contacts arranged around the mounting portion to come into contact with tips of lead terminals extending from the IC package; and
  a cover member having an opening at a center thereof and mounted vertically movable to the socket body to open and close the contacts;
  wherein the opening has its lower edge formed into a square facing the mounting portion and has inclined guide wall surfaces for guiding the IC package onto the mounting portion; and
  wherein the inclined guide wall surfaces are arranged symmetrical with respect to longitudinal and lateral center lines of the square opening and each inclined guide wall surface comprises a first inclined guide wall surface crossing each of the center lines, a second inclined guide wall surface provided at each corner portion and having an inclination angle larger than an inclination angle of the first inclined guide wall surface, and a third inclined guide wall surface connecting to the first and second inclined guide wall surfaces.

6. An IC socket as claimed in claim 5, the contacts further comprising:
  a base portion embedded in the socket body;
  a first arm extending from the base portion and having a first contact at its tip; and a second arm extending from the base portion and having a second contact at its tip and a curved elastic portion at an intermediate position of the second arm.

7. An IC socket as claimed in claim 6, wherein the first contacts at the tips of the first arms are secured to the socket body.

8. An IC socket as claimed in claim 7, wherein two opposing sides of the opening almost match with an envelope joining outer ends of the first contacts of the first arms of the contacts.

9. An IC socket as claimed in claim 7, wherein at least two opposing sides of the opening almost match with an envelope joining tips of lead terminals extending from the IC package.

* * * * *

UNITED STATES PATENT AND TRADEMARK OFFICE
CERTIFICATE OF CORRECTION

PATENT NO. : 6,746,251 B2
DATED : June 8, 2004
INVENTOR(S) : Katunori Takahashi

It is certified that error appears in the above-identified patent and that said Letters Patent is hereby corrected as shown below:

Column 6,
Line 16, "portions" should read -- portion --.

Signed and Sealed this

Fifteenth Day of March, 2005

JON W. DUDAS
*Director of the United States Patent and Trademark Office*